United States Patent [19]

Choi et al.

[11] Patent Number: 4,995,552

[45] Date of Patent: Feb. 26, 1991

[54] ANTI-OXIDATION SYSTEM OF A WIRE BONDER USING A COPPER WIRE

[75] Inventors: Wan-Kyoon Choi; Jong-Whan Kim, both of Buchun, Rep. of Korea

[73] Assignee: SamSung Electronics Co. Ltd., Suweon, Rep. of Korea

[21] Appl. No.: 356,547

[22] Filed: May 23, 1989

[30] Foreign Application Priority Data

Jun. 2, 1988 [KR] Rep. of Korea .................. 1988-6623
Jun. 30, 1988 [KR] Rep. of Korea .................. 1988-8038

[51] Int. Cl.$^5$ .......................................... H01L 21/60
[52] U.S. Cl. ................................. 228/179; 228/4.5; 228/220
[58] Field of Search .............. 228/4.5, 179, 220, 904, 228/42, 1.1, 219

[56] References Cited

U.S. PATENT DOCUMENTS

4,451,541  5/1984  Beal ................................. 228/220

FOREIGN PATENT DOCUMENTS

0007137  1/1985  Japan .............................. 228/4.5
0159743  7/1986  Japan .............................. 228/4.5

OTHER PUBLICATIONS

Metals Handbook Ninth Edition; vol. 6 Welding, Brazing and Soldering; 1983, p. 217.

Primary Examiner—Richard K. Seidel
Assistant Examiner—James Miner
Attorney, Agent, or Firm—Bushnell, Robert E.

[57] ABSTRACT

An anti-oxidation system of a wire bonder for bonding a wire between a chip pad and a lead frame for a semiconductor device, said wire being comprised of an oxidizable material such as copper or aluminum, wherein a reduction gas for preventing oxidation of the wire is periodically supplied around a spool wound by said wire, at least one gas tube for supplying the reduction gas is disposed towards both sides of a capillary device drawing out the wire, said gas tubes being disposed just beneath the end of capillary device in opposite directions to each other, and a torch being disposed facing with a lower surface of either one of said gas tubes and just beneath the capillary device.

15 Claims, 4 Drawing Sheets

ANTI-OXIDATION SYSTEM OF A WIRE BONDER USING A COPPER WIRE

BACKGROUND OF THE INVENTION

The present invention relates to a wire bonding apparatus, and in particular to a wire bonder capable of preventing oxidation of a wire when applying a copper wire in order to enhance the bonding force and the mechanical strength of wiring material for use in semiconductor devices.

It is generally well known in the art that upon wiring operation between a chip and a pad of a lead frame during a semiconductor manufacturing process, there are used a ball bonding method bonding by forming a ball at a free end of a wire or a heat-press bonding method bonding directly the wire to the pad, of which the ball bonding method is preferred, as it not only makes a bonding area wider but also provides more stable bonding, rather than the heat-press bonding method.

A known bonding apparatus, as shown in FIG. 1, is constructed such that a wire 20 is wound into a spool 2 being isolated from an outer atmosphere by a cover 1, and it is drawn out through a take-out tube 3 at a center thereof, being supported and guided by a plurality of clamps 4. Thereafter, the wire passes through a capillary device 5 disposed adjacent to the clamp, said capillary device carrying out the wiring operation by moving between the lead frame and the chip pads. However, such a known wire bonding apparatus has a disadvantage that its spool mounter may not provide a complete wire shield from the atmosphere, thereby causing a considerable oxidation of the wire. Upon this bonding operation, as a gold wire is generally used for several days, it has become a factor increasing the manufacturing cost of a semiconductor chip. Further, there has been a problem that the yield eventually decreases because the wire droops or extends due to the heat being applied during a packaging process. Moreover, even though using a copper wire of higher mechanical strength in order to solve the problem, there still remains a problem that the copper wire is easily oxidized at high temperature, thereby affecting its bonding strength.

SUMMARY OF THE INVENTION

Therefore, the present invention is contrived to solve the problem as aforementioned, and it is an object of the present invention to provide an anti-oxidation system for a spool mounter of a wire bonder capable of preventing oxidation of the wire, even if a copper wire or an aluminium wire is applied therefor, by completely isolating from the outer atmosphere an inner part of the spool mounter containing the wire.

Another object of the present invention is to provide an anti-oxidation system of a wire bonder for preventing the oxidation of a copper wire drawn out, by forming a reduction environment around the copper wire upon forming a ball of copper wire during a ball bonding operation.

According to the present invention, an anti-oxidation system of a wire bonder for bonding a wire between a chip pad and a lead frame for a semiconductor device, said wire being comprised of an oxidized material such as copper or aluminium, is constructed so that a reduction gas for preventing oxidation of the wire is periodically supplied around a spool wound with said wire, at least one gas tube for supplying the reduction gas is disposed towards both sides of a capillary device drawing out the wire, said gas tubes being disposed, just beneath the end of capillary device, in opposite directions to each other, and a torch is disposed facing with a lower surface of either one of said gas tubes and just beneath the capillary device.

BRIEF DESCRIPTION OF THE DRAWINGS

The features and advantages of the system according to the invention will now be explained hereinafter with reference to the accompanying drawings, wherein.

DETAILED DESCRIPTION OF THE INVENTION

Figure 1:
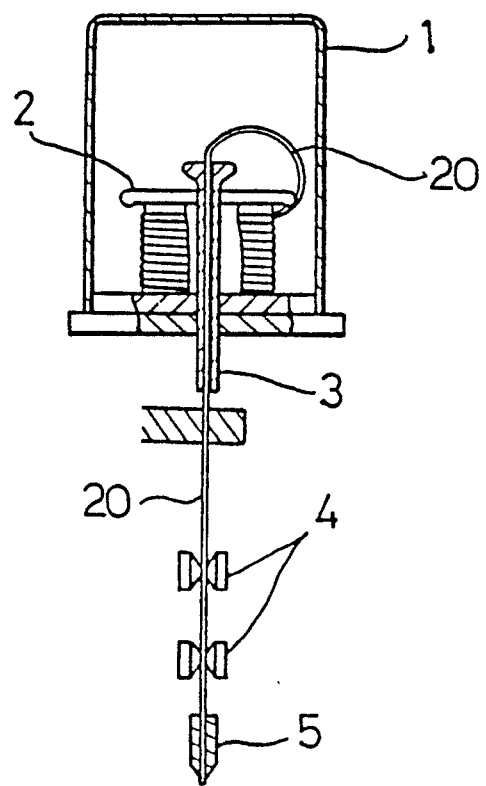
FIG. 1 is a schematic diagram showing a conventional wire bonder.

A preferred embodiment of the present invention will be described in detail with reference to the accompanying drawings hereinafter. In this embodiment, like parts as in FIG. 1 are designated with like numerals for a convenience of description.

Figure 2:
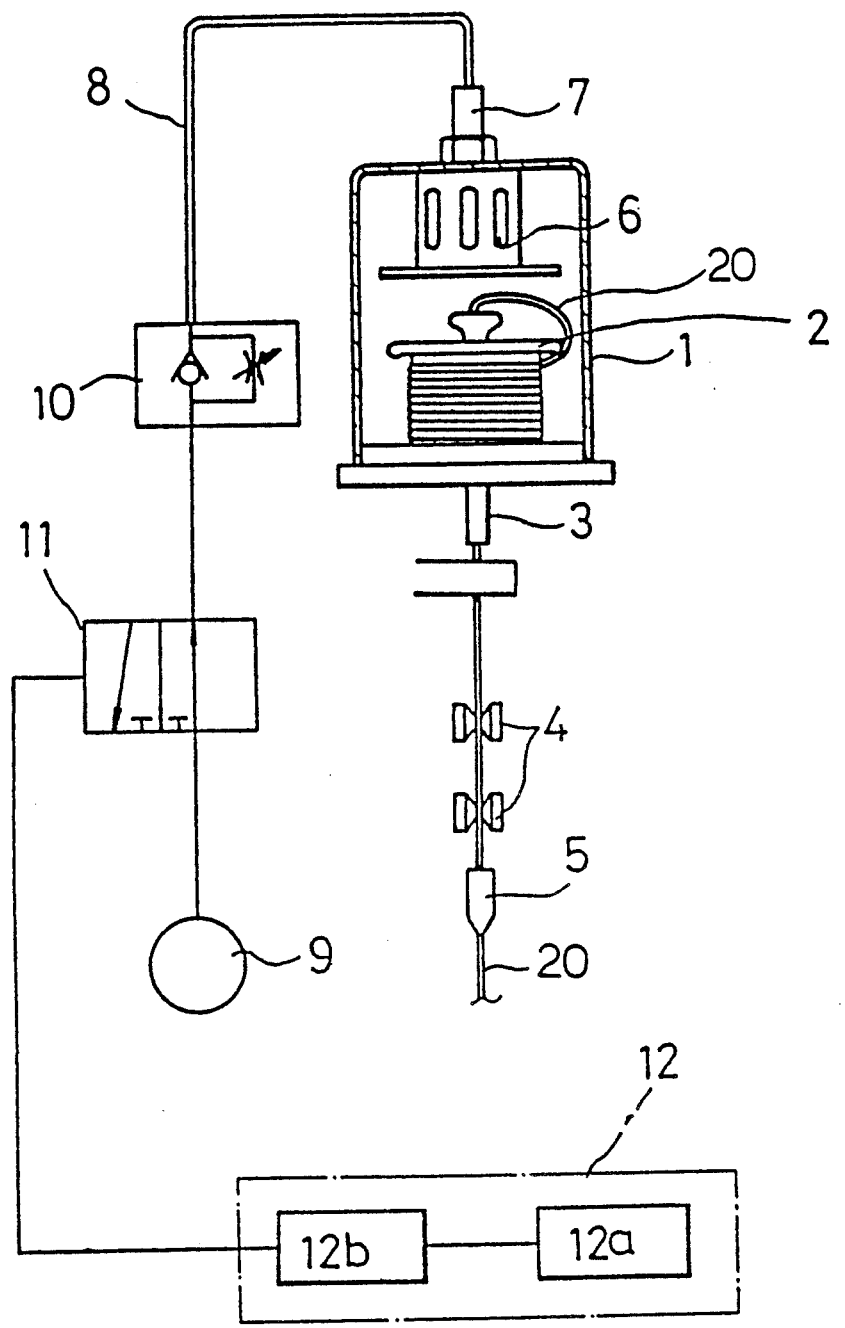
FIG. 2 is a schematic diagram showing an anti-oxidation system according to a preferred embodiment of the present invention.
Figure 3:
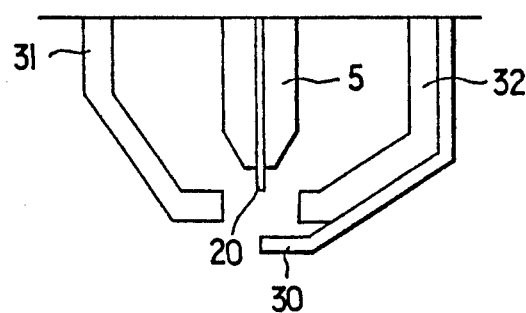
FIG. 3 is an enlarged detailed diagram of (A) portion in FIG. 2.

Referring to FIG. 2 now, a diffuser 6 is disposed at an internal upper section of a cover 1, and this diffuser 6 is connected to a gas container 9 by the way of a conduit tube 8 extending through a connecting tube 7. And a gas flow controller 10 and a solenoid valve 11 are interposed in the way of the connecting tube 7, and this solenoid valve 11 is made to open for 10 seconds and to close for 20 seconds periodically, being controlled by a timer 12. Any type of said timers can be applied if it is adapted so that a signal calculated at an electronic timer 12a is passed through an amplifier 12b and then applied to the solenoid 11 to thereby drive it to open or close. Further, and referring now to FIG. 3, gas tubes 31, 32 are arranged at both ends of a capillary device 5 capable of drawing out the wire, and a torch 30 is arranged facing an outer surface of either one of side gas tubes 31, 32 and just beneath the capillary device 5.

The wire 20 wound on the spool 2 within the cover 1 is drawn out through a take-out tube 3 and then guided to the capillary device 5 by a number of clamps 4 as aforementioned. At this moment, solenoid valve 11 is periodically opened and closed under the control of the timer 12, a process whereby inactive gas within the gas container 9 is injected or not into the inside of the cover 1 through the gas flow controller 10, is repeated in a time interval of 10-second injections and 20-second pause. For the inactive gas, a mixture gas of hydrogen and nitrogen or a mixture gas of hydrogen and argon will be preferred.

Further, a gas feeding quantity is controlled by the gas flow controller 10 so that the gas pressure within the cover 1 reaches to an extent that the wire 20 will be released smoothly from the spool 2. Thus, the inactive gas injected into the interior of the cover 1 is dispersed around the spool by the diffuser 6 without contacting directly with the wire 20, and eventually, an oxidation of the wire 20 will be prevented by forming the surrounding air of the wire 20 within the interior of the cover 1, into the reduction environment.

Figure 4A:
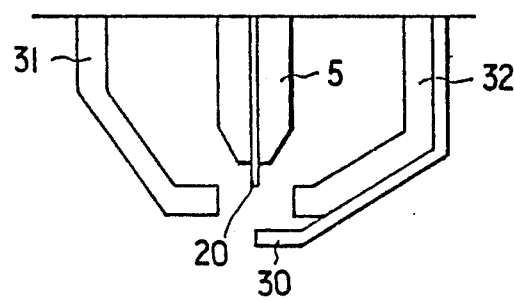
FIGS. 4A to 4E are process diagrams a of bonding operation according to the present invention.
Figure 4B:
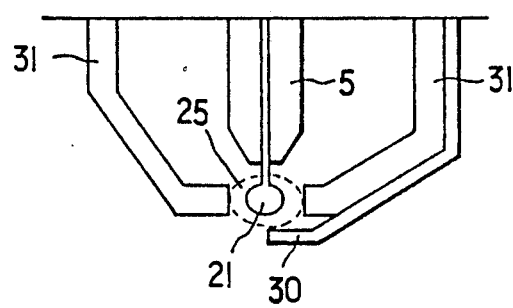

The wire 20 released out of the spool 2 is held by the clamps 4 through the take-out tube 3, and as shown in FIG. 4(A), the wire 20 is drawn out by a small length through a center hole of the capiary 5. And then, as shown in FIG. 4(B), when the drawn-out wire 20 reaches just near the torch 30, an electric discharge is made and the end of wire 20 fuses so that a ball 21 is formed by its surface tension. At this moment, a reduction gas is blown through the gas tubes 31, 32 from the right and left of the ball 21 so as not to be formed with (i.e., to prevent formation of) an oxidation layer on the ball 21, thereby the oxidation of the ball 21 being prevented.

Though various kinds of reduction gases may be used as the reduction gas, in the present invention, a mixture gas of hydrogen and nitrogen ($H_2+N_2$) or a mixture gas of argon and hydrogen ($Ar+H_2$) will be preferable. However, any combination of such gases may be used.

Figure 4C:
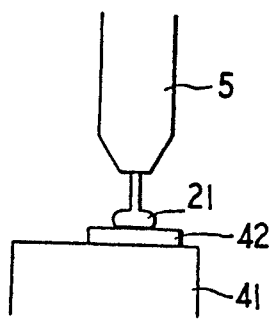

Thereafter, the ball 21 formed at the end of the capillary device 5, as shown in FIG. 4(C), is bonded to a pad 42 laid on the top surface of a chip 41, wherein it is also desirable to form a reduction atmosphere around the ball by blowing the reduction gas continuously, so as not to be oxidized with the wire 20.

Figure 4D:
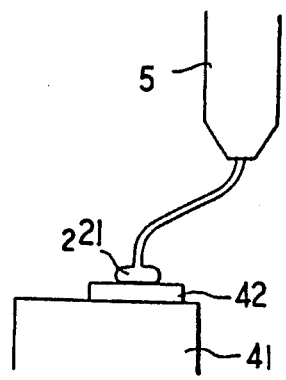
Figure 4E:
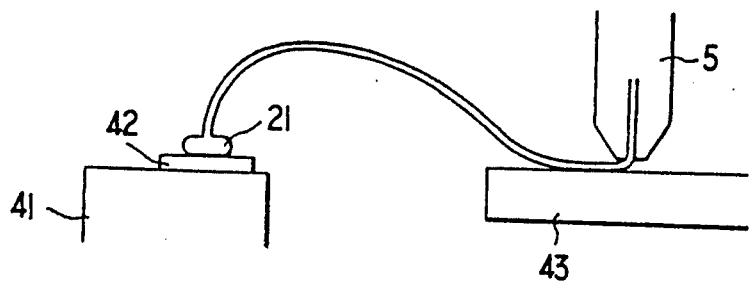

After the ball 21 is bonded to the pad 42, the wire 20 is drawn out from the capillary device 5, as shown in FIG. 4(D), and then it moves to right side of a lead frame 43. Thereafter as shown in FIG. 4(E), it is welded onto a metal coated surface which is formed for the purpose of improving the bonding upon the lead frame 43, and then the wire 20 is cut.

A single entire wire bonding work consists of repeating operations of the above described processes, in which it is desirable to form a reduction atmosphere by blowing the reduction gas continuously so as to prevent the wire from being oxidized.

As is apparent from the aforementioned description, according to the present invention, since the oxidation of the wire connecting the chip and the lead frame is prevented by processing within a reduction atmosphere, the bonding may be executed by using copper wire rather than gold wire so that the manufacturing cost can be decreased. Moreover, by utilizing the copper wire whose mechanical strength is high, a loop defect of the wire upon package molding will be prevented, thereby increasing a reliability of the product. Further, since compound production speed between the pad metal and other metal of the chip is generally low, the reliability of product may be improved.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. An anti-oxidation system of a wire bonder for bonding a wire between a chip pad and a lead frame for a semiconductor device, said wire being an oxidizable material selected from the group including copper or aluminum, comprising:
   means for creating an atmosphere of a reduction gas for preventing oxidation of the wire by periodically supplying said reduction gas around a spool wound with said wire,
   at least one gas tube for supplying the reduction gas disposed towards at least one of opposite sides of a capillary device drawing out the wire, said gas tube being disposed, just beneath the end of the capillary device, transversely to a direction of passage of the wire through the capillary device, and
   a torch disposed facing a lower surface of either said one gas tube and another gas tube, just beneath the capillary device.

2. An anti-oxidation system of a wire bonder according to claim 1, wherein said reduction gas is a mixture gas of hydrogen and nitrogen or a mixture gas of argon and hydrogen or any other combination of such materials.

3. An anti-oxidation system, comprising:
   closed container means for surrounding a receptacle of an oxidizable wire;
   capillary means for dispensing the oxidizable wire from inside said container means through a first opening in said container;
   means for maintaining a non-oxidizing gaseous atmosphere within said closed container at a pressure sufficient to assure smooth said dispensing of the wire via said capillary means;
   means disposed externally to said container means, for deforming a portion of said wire during said dispensing of the wire; and
   means disposed externally to said container means, for enveloping said portion of the wire with the non-oxidizing gaseous atmosphere during said deformation.

4. The system of claim 3, further comprised of said enveloping means having a plurality of conduits disposed in proximity to said capillary means for discharging the non-oxidizing gaseous atmosphere on opposite sides of the portion of wire emanating from said capillary means.

5. The system of claim 4, further comprised of said deforming means disposed in proximity to a lower surface of one of said conduits.

6. The system of claim 3, further comprised of said deforming means disposed in proximity to a lower surface of said enveloping means.

7. A process of bonding a wire made of an oxidizable material to a chip of a semiconductor device, comprising:
   maintaining a receptacle of an oxidizable wire within a non-oxidizing gaseous atmosphere;
   periodically dispensing the wire from the receptacle and towards a contact pad of a semiconductor chip via a capillary while the non-oxidizing gaseous atmosphere is maintained within the receptacle and capillary at a pressure assuring smooth discharge of the wire through the capillary;
   deforming a terminal end of the wire into a ball while enveloping the terminal end in the non-oxidizing gaseous atmosphere; and
   bonding the ball onto the contact pad of a semiconductor chip.

8. The process of claim 7, further comprised of discharging the non-oxidizing gaseous atmosphere toward either side of the terminal end while deforming the terminal end.

9. The process of claim 7, further comprised of selecting the non-oxidizing gaseous atmosphere from the group including mixtures of hydrogen and nitrogen, and of argon and hydrogen.

10. The process of claim 7, further comprised of said non-oxidizing gaseous atmosphere being a mixture of hydrogen and nitrogen.

11. A wire bonder, comprising:
housing means including means having an orifice for dispensing wire from inside said housing means, said housing means for surrounding a receptacle of wire and the wire associated with the receptacle;
means disposed externally to said housing means, for deforming a portion of the said wire during said dispensing of the wire; and
means for maintaining a non-oxidizing gaseous atmosphere within said housing means at a pressure assuring smooth said dispensing of the wire via said dispensing means, and for enveloping said portion of the wire with the non-oxidizing gaseous atmosphere during said deformation.

12. The wire bonder of claim 11, further comprised of said maintaining means having a plurality of conduits disposed externally to said housing means in proximity to said dispensing means, for discharging the non-oxidizing gaseous atmosphere on opposite sides of the portion of wire emanating from said capillary means.

13. The wire bonder of claim 12, further comprised of said deforming means disposed in proximity to a lower surface of one of said conduits.

14. The wire bonder of claim 11, further comprised of said deforming means disposed in proximity to a lower surface of said housing means.

15. The wire bonder of claim 11, further comprised of said maintaining means discharging the non-oxidizing gaseous atmosphere toward both sides of the portion of the wire while deforming the terminal end.

* * * * *